United States Patent
Yamaguchi et al.

(10) Patent No.: US 12,104,251 B2
(45) Date of Patent: Oct. 1, 2024

(54) SUBSTRATE PROCESSING METHOD AND SUBSTRATE PROCESSING APPARATUS

(71) Applicant: Tokyo Electron Limited, Tokyo (JP)

(72) Inventors: Tatsuya Yamaguchi, Nirasaki (JP); Syuji Nozawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 169 days.

(21) Appl. No.: 16/823,873

(22) Filed: Mar. 19, 2020

(65) Prior Publication Data

US 2020/0299840 A1    Sep. 24, 2020

(30) Foreign Application Priority Data

Mar. 22, 2019 (JP) ................. 2019-055096

(51) Int. Cl.
| | | |
|---|---|---|
| *C23C 16/00* | (2006.01) | |
| *C23C 16/02* | (2006.01) | |
| *C23C 16/40* | (2006.01) | |
| *C23C 16/48* | (2006.01) | |

(52) U.S. Cl.
CPC .......... *C23C 16/48* (2013.01); *C23C 16/0209* (2013.01); *C23C 16/401* (2013.01)

(58) Field of Classification Search
CPC .......... C23C 16/00; H01L 23/00; H01L 21/00
See application file for complete search history.

(56) References Cited

U.S. PATENT DOCUMENTS

| | | | | |
|---|---|---|---|---|
| 5,807,785 A | * | 9/1998 | Ravi | .................. H01L 23/5329 |
| | | | | 257/E21.279 |
| 2004/0096593 A1 | * | 5/2004 | Lukas | .............. H01L 21/02216 |
| | | | | 427/551 |
| 2005/0124172 A1 | * | 6/2005 | Townsend, III | .. H01L 21/02203 |
| | | | | 257/E21.259 |
| 2008/0200034 A1 | * | 8/2008 | Lin | ................... H01L 21/76826 |
| | | | | 257/E21.256 |
| 2009/0104571 A1 | * | 4/2009 | Liu | ..................... H01L 21/7682 |
| | | | | 430/327 |

(Continued)

FOREIGN PATENT DOCUMENTS

| | | |
|---|---|---|
| JP | 2011-503840 A | 1/2011 |
| JP | 2012-54307 A | 3/2012 |
| KR | 1020040042853 A | 5/2004 |

*Primary Examiner* — Kelly M Gambetta
*Assistant Examiner* — Mohammad Mayy
(74) *Attorney, Agent, or Firm* — Nath, Goldberg & Meyer; Jerald L. Meyer; Tanya E. Harkins

(57) ABSTRACT

A substrate processing method includes: forming a coating film so as to cover a front surface of the substrate, the substrate having a recess formed in the front surface and in which an organic film is formed; heating the substrate to turn the organic film into a gas, removing the gas from an interior of the recess by causing the gas to pass through the coating film, and forming in the substrate a sealed space surrounded by the recess and the coating film; supplying a processing gas into the sealed space; and irradiating the substrate with a light to activate the processing gas in the sealed space, causing a reaction product gas to pass through the coating film, and removing the reaction product gas, wherein the reaction product gas is generated by a reaction between a residue of the organic film and the activated processing gas in the sealed space.

6 Claims, 11 Drawing Sheets

(56) References Cited

U.S. PATENT DOCUMENTS

| | | | |
|---|---|---|---|
| 2009/0130863 A1* | 5/2009 | Toma | H01L 23/53295 438/795 |
| 2012/0070957 A1* | 3/2012 | Mallick | H01L 21/02208 257/E21.573 |
| 2018/0068848 A1 | 3/2018 | Shohet et al. | |

* cited by examiner

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2019-055096, filed on Mar. 22, 2019, the entire contents of which are incorporated herein by reference.

TECHNICAL FIELD

The present disclosure relates to a substrate processing method and a substrate processing apparatus.

BACKGROUND

In a semiconductor device manufacturing process, various films are formed on a semiconductor wafer (hereinafter, referred to as a "wafer") as a substrate, and a wiring pattern is formed on each film. In addition, in order to make the electrical characteristics between the wiring lines of the semiconductor device appropriate, there is a case where a gap (air gap) is formed in each film. In Patent Document 1, an interlayer insulating film is formed by chemical vapor deposition (CVD) on a front surface of a wafer in which a groove having a relatively high aspect ratio is formed. The film formation rate by CVD is higher at the entrance of the groove than at the bottom of the groove. Thus, insulating films are connected to each other at the entrance of the groove during the film formation, so that the above air gap is formed.

PRIOR ART DOCUMENT

Patent Document

Patent Document 1: Japanese Laid-Open Patent Publication No. 2012-054307

SUMMARY

According to one embodiment of the present disclosure, there is provided a method of processing a substrate, the method including: forming a coating film so as to cover a front surface of the substrate, the substrate having a recess formed in the front surface and in which an organic film is formed; heating the substrate to turn the organic film into a gas, removing the gas from an interior of the recess by causing the gas to pass through the coating film, and forming in the substrate a sealed space surrounded by the recess and the coating film; supplying a processing gas into the sealed space; and irradiating the substrate with a light to activate the processing gas in the sealed space, causing a reaction product gas to pass through the coating film, and removing the reaction product gas, wherein the reaction product gas is generated by a reaction between a residue of the organic film and the activated processing gas in the sealed space.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A substrate processing according to an embodiment of the present disclosure will be described with reference to FIGS. 1A to 1D, and FIGS. 2A and 2B, which are schematic vertical cross-sectional views of the wafer W. Each of these figures illustrates a state in which a front surface of the wafer W is changed by performing a series of processes on the wafer W. Each of the series of processes is performed in a state in which the wafer W is accommodated in a processing container and a vacuum atmosphere is formed around the wafer W by exhausting the interior of the processing container.

Figure 1A:
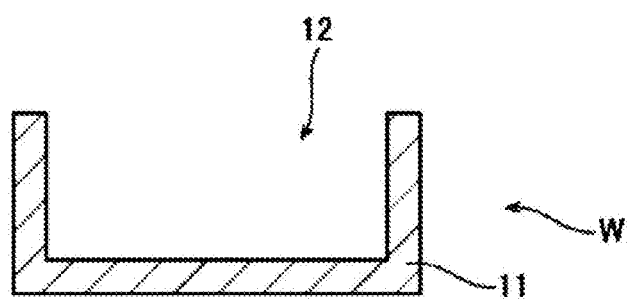
FIG. 1A is a schematic vertical cross-sectional view illustrating a substrate processing step according to an embodiment of the present disclosure.

FIG. 1A illustrates the wafer W before the substrate processing. A layer 11 composed of, for example, silicon oxide ($SiO_2$) is formed on the front surface of the wafer W. A recess 12, which is a pattern for forming wirings on the wafer W, is formed in the layer 11. First, a film-forming gas for forming an organic film is supplied to the wafer W. As the organic film, for example, a polyurea film 13 as a polymer having a urea bond is formed so as to be buried in the recess 12.

Figure 1B:
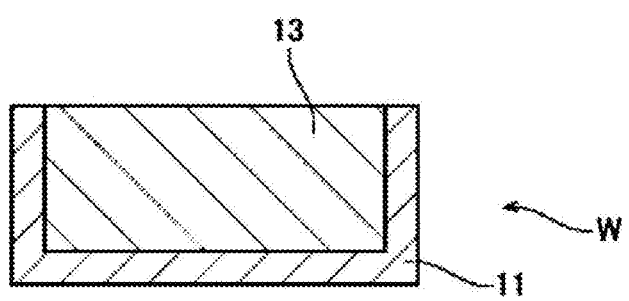
FIG. 1B is a schematic vertical cross-sectional view illustrating the substrate processing step.

Thereafter, the wafer W is heated to a predetermined temperature so as to depolymerize the polyurea film 13 and remove a limited portion of the front surface of the wafer W. The removal of the limited portion of the front surface is performed such that the polyurea film 13 remains in the recess 12 while the polyurea film 13 is entirely removed in the outside of the recess 12 so as to expose a front surface of the layer 11. For example, by repeating a cycle including the formation of the polyurea film 13 and the removal of the front surface portion of the polyurea film 13, the polyurea film 13 is repeatedly deposited in the recess 12. A film thickness of the polyurea film 13 is increased until the front surface of the polyurea film 13 reaches a desired height. FIG. 1B illustrates an example in which the polyurea film 13 is formed such that the height of the front surface thereof is equal to the outer height of the recess 12.

Figure 1C:
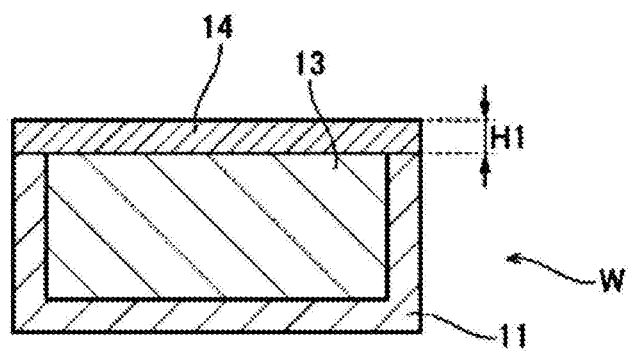
FIG. 1C is a schematic vertical cross-sectional view illustrating the substrate processing step.

After the above cycle has been performed a predetermined number of times, a film-forming gas for forming a cap film is supplied to the front surface of the wafer W so that a cap film 14 as a coating film is formed so as to cover the front surface of the wafer W. More specifically, the cap film 14 is formed so as to come into contact with the outside of the recess 12 in the layer 11 and the front surface of the polyurea film 13 and to close the recess 12 (FIG. 1C). The cap film 14 is made of, for example, $SiO_2$. In order to remove the polyurea film 13 remaining in a gas state and a residue generated from the polyurea film 13 from the recess 12 as will be described later, the cap film 14 has a permeability to the gas. A thickness H1 of the cap film 14 is set to, for example, 10 nm or less so as to have such a gas permeability. In addition, the cap film 14 has transparency to vacuum ultraviolet light (VUV) and relatively high resistance to radicals generated by the VUV (described later) so that the residue can be removed. For example, the gas permeability of the cap film 14 to an oxygen gas used for removing the residue is 1 g/m² day or less at normal temperature and in normal pressure atmosphere.

Figure 1D:
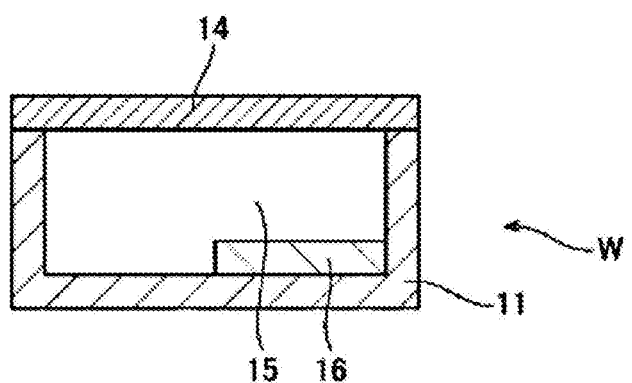
FIG. 1D is a schematic vertical cross-sectional view illustrating the substrate processing step.

After the formation of the cap film 14, the wafer W is heated to a predetermined temperature, for example, a temperature of 350 degrees C. or higher, so that the polyurea film 13 serving as a sacrificial film is depolymerized and gasified. The generated gas passes through the cap film 14 and is removed from the interior of the recess 12. By removing the polyurea film 13 from the interior of the recess 12 in this manner, a sealed space 15 is formed as an empty hole surrounded by the recess 12 and the cap film 14. This sealed space 15 constitutes the air gap described above. While the sealed space 15 is formed in this manner, a portion of the polyurea film 13 is altered to produce an organic residue 16. The residue 16 remains in the sealed space 15 as, for example, solid foreign matter (FIG. 1D).

Subsequently, in a state in which the wafer W is heated to, for example, 100 degrees C. to 300 degrees C., for example, an oxygen ($O_2$) gas is supplied to the wafer W as a processing gas for removing the residue 16, and the front surface of the wafer W is irradiated with, for example, VUV having a wavelength of 172 nm. The $O_2$ gas passes through the cap film 14 and diffuses in the sealed space 15. In addition, the VUV is also supplied to the sealed space 15 through the cap film 14. The $O_2$ gas, which has diffused in the sealed space 15, is activated by receiving energy from the VUV. Specifically, oxygen radicals and an ozone gas are generated from $O_2$ gas. The ozone gas is further decomposed to generate oxygen radicals. The arrows in FIG. 2A denote VUV, reference numeral 21 denotes the oxygen gas before activation, and reference numeral 22 denotes the oxygen gas after activation, that is, the oxygen radicals. The oxygen radicals 22 thus generated in the sealed space 15 react with the residue 16, and the residue 16 is decomposed into water and gases having a relatively small molecular weight, such as carbon dioxide and carbon monoxide. These gases pass through the cap film 14 and are removed from the sealed space 15.

Figure 2A:
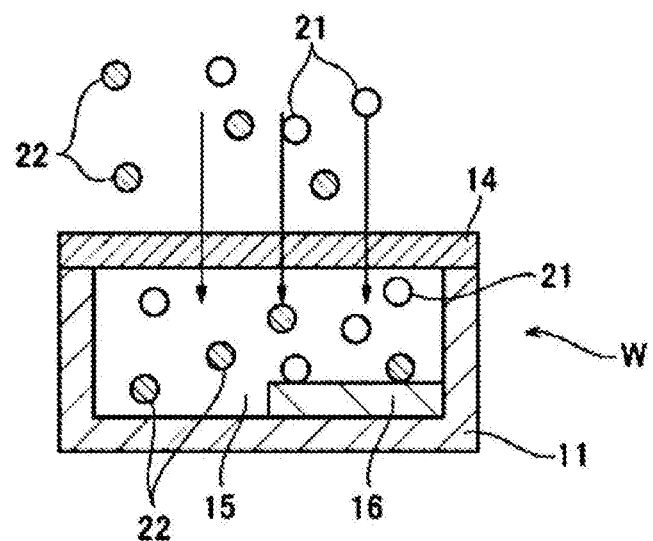
FIG. 2A is a schematic vertical cross-sectional view illustrating the substrate processing step.
Figure 2B:
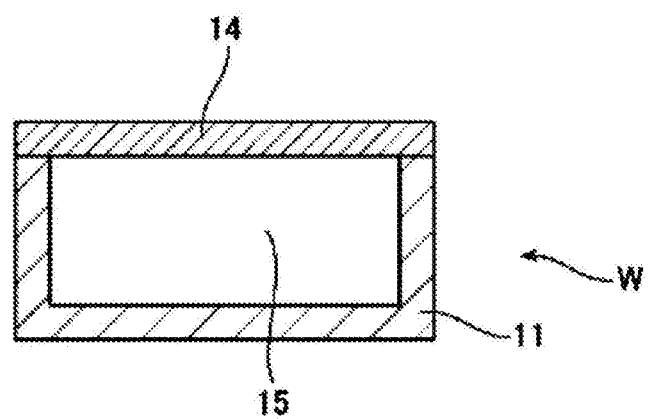
FIG. 2B is a schematic vertical cross-sectional view illustrating the substrate processing step.

In a case where a partial pressure of the $O_2$ gas around the wafer W during the above-mentioned VUV irradiation is too low, the amount of generated oxygen radicals is small. Thus, the residue may not be sufficiently removed. Meanwhile, in a case where the partial pressure of the $O_2$ gas is too high, the amount of VUV to be supplied to the sealed space 15 decreases by being absorbed by the $O_2$ gas around the wafer W before reaching the sealed space 15. Thus, the activation effect of the $O_2$ gas in the sealed space 15 may be weakened. Therefore, as shown in an evaluation test described later, the partial pressure of the $O_2$ gas around the wafer W during the VUV irradiation may be set to, for example, $1.33 \times 10^3$ Pa (10 Torr) to $2.66 \times 10^3$ Pa (20 Torr). After the residue 16 is decomposed and removed from the sealed space 15, the supply of the $O_2$ gas to the wafer W and the VUV irradiation are stopped, and a series of processes are terminated (FIG. 2B).

Meanwhile, in removing the residue 16, it is assumed that, instead of generating the radicals in the sealed space 15 by the VUV irradiation and the supply of the $O_2$ gas described with reference to FIG. 2A, radicals were supplied from the outside of the sealed space 15. However, the radicals generated outside the sealed space 15 are deactivated while passing through the cap film 14 and hardly act on the residue 16. In addition, it is conceivable to radiate VUV without supplying the $O_2$ gas to the sealed space 15, that is, to remove the residue 16, which is an organic substance, only by the action of VUV without relying on the action of radicals. However, as shown in the evaluation test described later, it is impossible to obtain a sufficient decomposition rate.

However, according to the processes described in the above embodiment, after forming the cap film 14, the polyurea film 13 is gasified and removed from the recess 12 through the cap film 14 by heating, so that the $O_2$ gas can be supplied into the recess 12 (the sealed space 15). Then, after the $O_2$ gas is supplied into the sealed space 15, VUV is irradiated so as to generate the radicals in the sealed space 15. Accordingly, the deactivation of radicals before the radicals acting on the residue 16 is suppressed, which makes it possible to remove the residue 16 highly reliably and quickly.

In addition, by removing the residue 16 as described above, in a process following the series of processes described above, it is possible to prevent the residue 16 from being gasified and affected, for example, when the wafer W is heated. Furthermore, it is possible to prevent electrical characteristics between the wirings formed on the wafer W from being affected due to the residue 16 staying in the sealed space 15. Therefore, according to the above embodiment, since it is possible to reliably remove the residue 16, there is an advantage in that it is possible to improve the yield of semiconductor products manufactured from the wafer W.

In addition, there is another method of forming the sealed space 15 comprising forming a sacrificial film having higher selectivity to an etching gas than the layer 11 constituting the recess 12, then forming the above-described cap film, and forming a minute hole in the cap film so as to overlap the recess 12 may be considered. After forming the hole, an etching gas is supplied into the recess 12 through the hole and diffused to remove the sacrificial film. Thereafter, a laminated film is formed on the cap film 14 by CVD such that the hole of the cap film 14 is closed. However, in such a method of forming the sealed space 15, in order to sufficiently diffuse the etching gas in the recess 12, the size of the recess 12, that is, the size of the sealed space 15 may become relatively large. Therefore, according to the above embodiment, there is an advantage in that it is possible to increase a degree of freedom of the size of the sealed space 15.

Meanwhile, the removal of the residue 16 after the formation of the sealed space 15 is not limited to the step illustrated in FIG. 2A, but may be performed in other steps described below.

Figure 3A:
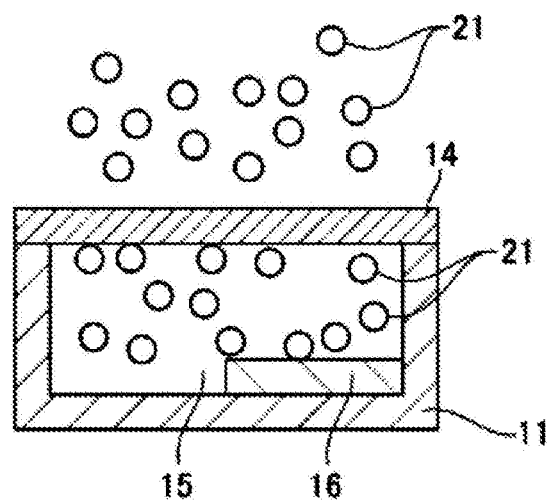
FIG. 3A is a schematic vertical cross-sectional view illustrating the substrate processing step.
Figure 3B:
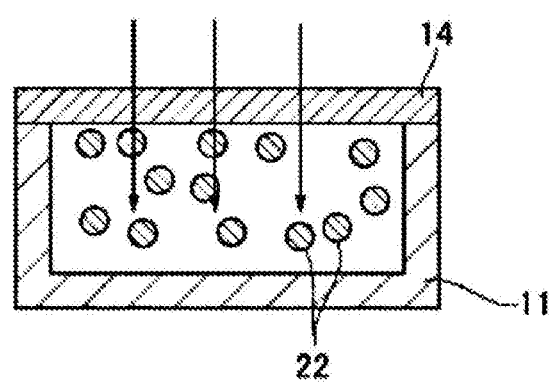
FIG. 3B is a schematic vertical cross-sectional view illustrating the substrate processing step.

FIGS. 3A and 3B illustrate other steps. Specifically, first, an $O_2$ gas is supplied to the wafer W, and a pressure around the wafer W (internal pressure of the processing chamber) is set to a second pressure, which is relatively high, for example, $1.33 \times 10^4$ Pa to $1.33 \times 10^5$ Pa. With such a pressure, the $O_2$ gas efficiently passes through the cap film 14 and is supplied into the sealed space 15, and the partial pressure of the $O_2$ gas in the sealed space 15 becomes relatively high (FIG. 3A). While the pressure around the wafer W is kept at the second pressure, the VUV is difficult to reach the wafer W by being absorbed to the gas around the wafer W. Thus, the VUV irradiation is not performed.

Thereafter, the pressure around the wafer W is set to a first pressure lower than the second pressure, specifically, for example, $1.33 \times 10$ Pa to $1.33 \times 10^2$ Pa. The wafer W is irradiated with VUV in the state in which the gas around the wafer W is difficult to absorb the VUV due to the decrease in the pressure. At this time, since the partial pressure of the $O_2$ gas in the sealed space 15 is high as described above, a relatively large number of oxygen radicals 22 are generated, and the residue 16 is more reliably removed (FIG. 3B). A difference between the first pressure and the second pressure is, for example, 10 Torr or more.

Figure 4:
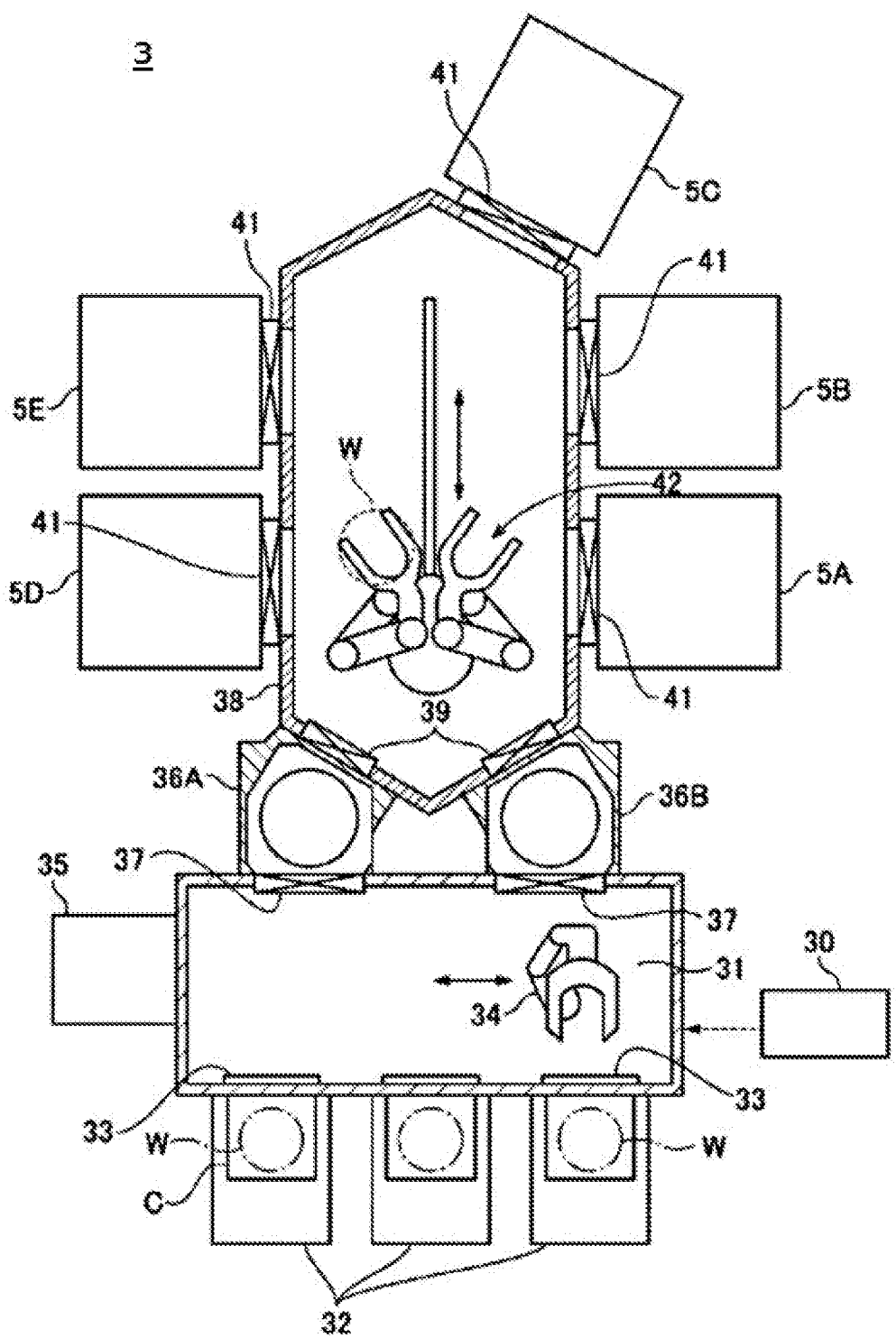
FIG. 4 is a plan view illustrating an embodiment of a substrate processing apparatus for performing the substrate processing steps.

Next, a substrate processing apparatus 3, which is an embodiment of an apparatus for performing the series of processes illustrated in FIGS. 1A to 1D, FIGS. 2A and 2B will be described with reference to a plan view of FIG. 4. The substrate processing apparatus 3 may perform the process described with reference to FIGS. 3A and 3B instead of the process illustrated in FIGS. 2A and 2B. The substrate processing apparatus 3 includes a normal-pressure transfer chamber 31, of which the internal atmosphere is set to a normal pressure atmosphere by, for example, dried nitrogen gas. In front of the normal-pressure transfer chamber 31, loading/unloading ports 32, each of which is configured to place a carrier C that stores the wafer W therein, are arranged side by side in the left-right direction. Doors 33, which are respectively opened/closed together with covers of the carriers C, are provided on the front wall of the normal-pressure transfer chamber 31. Inside the normal-pressure transfer chamber 31, a first transfer mechanism 34 including an articulated arm for transferring the wafer W is provided. In addition, on the left side wall of the normal-pressure transfer chamber 31 when viewed from the side of the loading/unloading ports 32, an alignment chamber 35 is provided to adjust the orientation or eccentricity of the wafer W.

On the opposite side of the loading/unloading ports 32 in the normal-pressure transfer chamber 31, for example, two load-lock chambers 36A and 36B are disposed so as to be arranged on the left and right. Gate valves 37 are provided between the load-lock chambers 36A and 36B and the normal-pressure transfer chamber 31. A vacuum transfer chamber 38 is arranged via gate valves 39 on the rear side of the load-lock chambers 36A and 36B when viewed from the side of the normal-pressure transfer chamber 31.

A polyurea film formation module 5A, an annealing module 5B, a cap film formation module 5C, an annealing module 5D, and a VUV irradiation module 5E are connected to the vacuum transfer chamber 38 via gate valves 41, respectively. The annealing module 5B is a module that removes an unnecessary portion of the front surface of the polyurea film 13 by heating the wafer W as described above in the filling of the recess 12 with the polyurea film 13. The annealing module 5D is a module that removes the polyurea film 13 by heating the wafer W after the formation of the cap film 14. The vacuum transfer chamber 38 is provided with a second transfer mechanism 42 having two transfer arms configured as articulated arms. The second transfer mechanism 42 delivers the wafers W among the load-lock chambers 36A and 36B, the polyurea film formation module 5A, the annealing modules 5B and 5D, the cap film formation module 5C, and the VUV irradiation module 5E.

Figure 5:
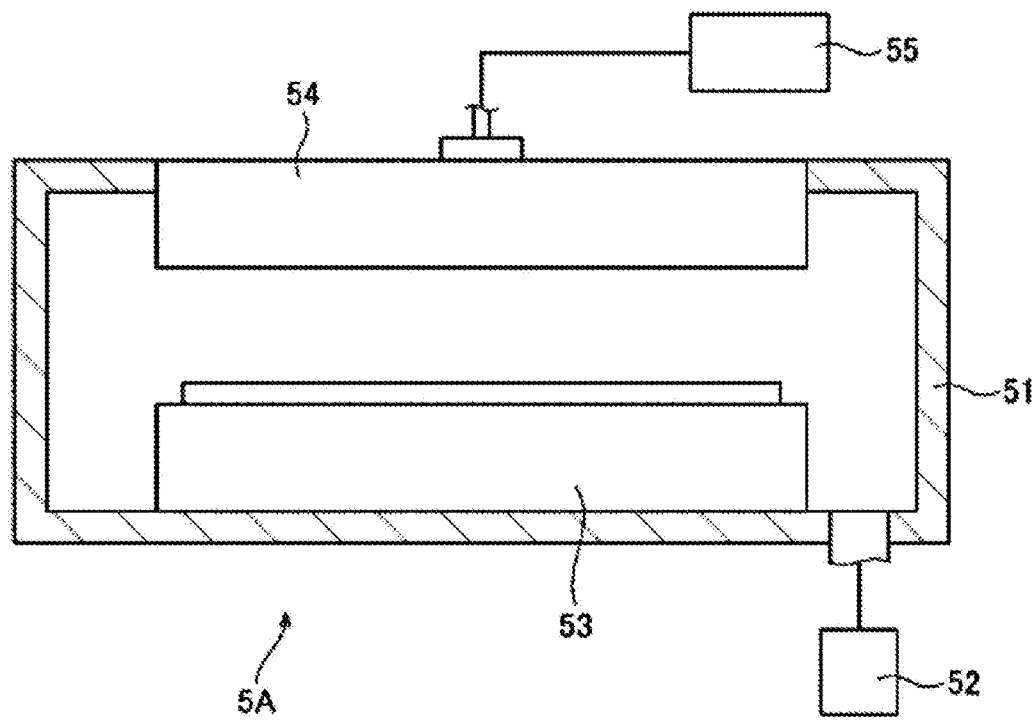
FIG. 5 is a vertical cross-sectional side view of a film formation module provided in the substrate processing apparatus.

FIG. 5 illustrates the polyurea film formation module 5A. For example, the polyurea film formation module 5A supplies each of a first film-forming gas containing H6XDA (1,3-bis (aminomethyl) cyclohexane) as diamine, and a second film-forming gas containing H6XDI (1,3-bis (isocyanatomethyl) cyclohexane) as diisocyanate to the wafer W. The polyurea film 13 is formed by vapor deposition polymerization of the H6XDA and H6XDI on the front surface of the wafer W.

In FIG. 5, reference numeral 51 denotes a processing container, and reference numeral 52 denotes an exhaust mechanism configured to exhaust the interior of the processing container 51 so as to form a vacuum atmosphere. In FIG. 5, reference numeral 53 denotes a stage configured to place the wafer W thereon. The stage 53 is provided with a heater for heating the wafer W placed thereon to an appropriate temperature during film formation. In FIG. 5, reference numeral 54 denotes a shower head provided to face the stage 53. In FIG. 5, reference numeral 55 denotes a gas supply mechanism 55 connected to the shower head 54. The gas supply mechanism 55 performs supply and cutoff of various gases with respect to the shower head 54 based on a control signal outputted from a controller 30 to be described later. A large number of ejection holes are formed in a lower surface of the shower head 54. Each gas supplied from the gas supply mechanism 55 to the shower head 54 is ejected from each ejection hole toward the wafer W on the stage 53.

In the state in which the wafer W placed on the stage 53 is heated to a predetermined temperature, the gas supply mechanism 55 performs a cyclic operation of sequentially supplying, for example, the first film-forming gas, a nitrogen ($N_2$) gas, the second film-forming gas, and a $N_2$ gas, so that the polyurea film 13 is formed on the wafer W. In addition, the $N_2$ gas supplied in this cyclic operation is a purge gas for removing unnecessary first film-forming gas and second film-forming gas inside the processing container 51.

Although the annealing modules 5B and 5D and the cap film formation module 5C are not illustrated, these modules have substantially the same configuration as, for example, the polyurea film formation module 5A. In the annealing modules 5B and 5D, the wafer W placed on the stage 53 is heated and annealed in the state in which the $N_2$ gas is supplied from the shower head 54 and the interior of the processing container 51 is in the $N_2$ gas atmosphere. In the cap film formation module 5C, the cap film 14 is formed on the wafer W by CVD by ejecting a film-forming gas for forming the cap film from the shower head 54 instead of the first film-forming gas and the second film-forming gas described above. The cap film formation module 5C constitutes a coating film formation part, and the annealing module 5D constitutes a heating part.

Figure 6:
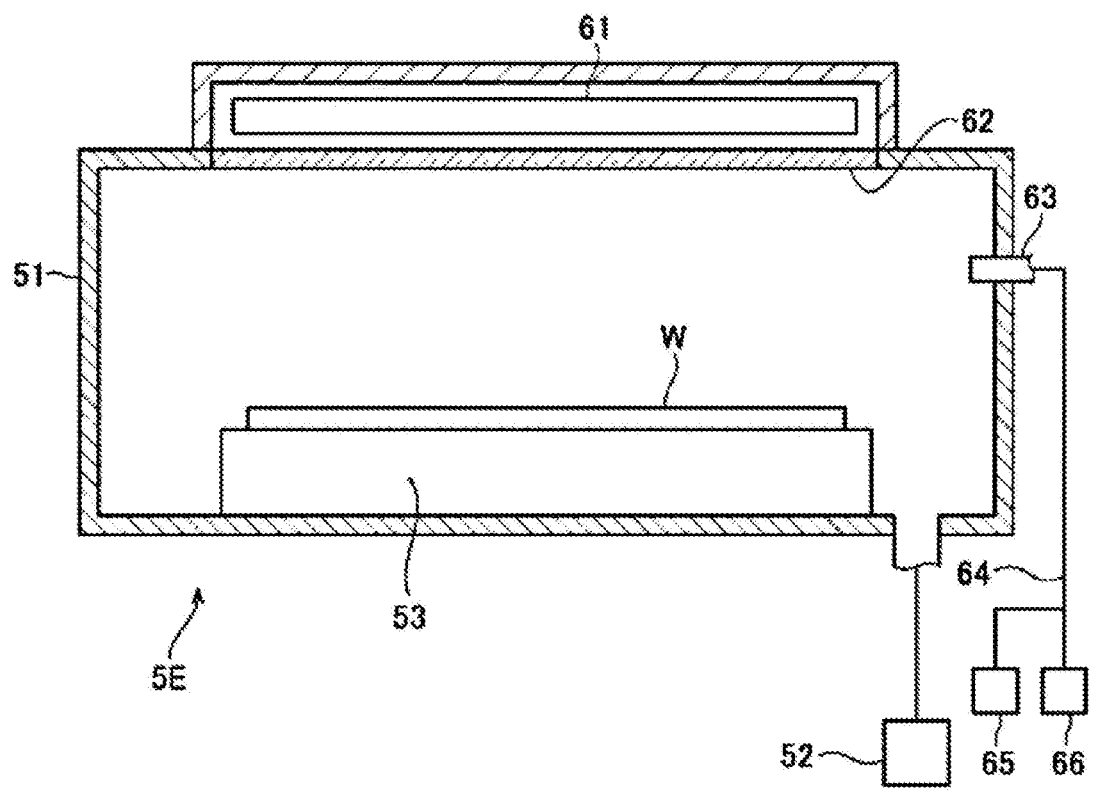
FIG. 6 is a vertical cross-sectional side view of a residue removal module provided in the substrate processing apparatus.

FIG. 6 illustrates the VUV irradiation module 5E constituting a gas supply part and a light irradiation part. The VUV irradiation module 5E includes a processing container 51, an exhaust mechanism 52, and a stage 53, like the polyurea film formation module 5A. In addition, the exhaust mechanism 52 includes, for example, a valve having a variable opening degree, and a pump configured to exhaust the interior of the processing container 51 via the valve. The degree of opening of the valve constituting the exhaust mechanism 52 varies in response to a control signal outputted from the controller 30 described later. The amount of gas exhausted from the processing container 51 varies depending on the variation in the degree of opening of the valve, so that the internal pressure of the processing container 51 is adjusted. A VUV light source 61 is provided inside the processing container 51 so as to face the stage 53. Thus, the wafer W on the stage 53 can be irradiated with the VUV through the window 62.

The VUV irradiation module 5E is provided with a nozzle 63 for ejecting gas into the processing container 51. One end of a pipe 64 is connected to the nozzle 63, and the other end of the pipe 64 is branched and connected to each of a $N_2$ gas supply mechanism 65 and an $O_2$ gas supply mechanism 66. Based on a control signal outputted from the controller 30, the $N_2$ gas supply mechanism 65 and the $O_2$ gas supply mechanism 66 respectively perform supply and cutoff of the $N_2$ gas and the $O_2$ gas with respect to the nozzle 63.

In the state in which the wafer W placed on the stage 53 is heated to a predetermined temperature and the $N_2$ gas and the $O_2$ gas are supplied into the processing container 51, VUV is irradiated from the light source 61 to the wafer W so as to perform the removal of the residue 16 by the oxygen radicals described above with reference to FIG. 2A. When the light irradiation is performed in this manner, the $N_2$ gas and the $O_2$ gas are supplied from the nozzle 63 such that the partial pressure of the $O_2$ gas inside the processing container 51 has a value within the range described above.

The VUV irradiation module 5E is also capable of performing the process described with reference to FIGS. 3A and 3B. In the case of performing the process of FIGS. 3A and 3B as described above, the $N_2$ gas and the $O_2$ gas are supplied into the processing container 51 from the nozzle 63 in the state in which the internal pressure of the processing container 51 is set to the relatively high second pressure by the exhaust mechanism 52. Then, when the internal pressure of the processing container 51 is reduced to the first pressure by the exhaust mechanism 52, the VUV irradiation is performed on the wafer W heated to a predetermined temperature, and thus the residue 16 is removed.

Referring back to FIG. 4, the substrate processing apparatus 3 includes the controller 30, which is a computer. The controller 30 includes a program, a memory, and a CPU. The program may be stored in a non-transitory computer-readable storage medium, such as a compact disc, a hard disc, a magneto-optical disc, a memory card, or a DVD, and may be installed on the controller 30. The controller 30 outputs a control signal to each part of the substrate processing apparatus 3 according to the program, and controls the operation of each part. Specifically, the program incorporates a group of steps so as to control the operation of each transfer mechanism, the opening and closing of the gate valves 37, 39, and 41 and the doors 33, the operation of each module, and the like in the substrate processing apparatus 3, and execute the series of processes described above with respect to the wafer W.

The operations in the substrate processing apparatus 3 and the transfer path of the wafer W will be described. When the carrier C accommodating the wafer W whose front surface is formed as described with reference to FIG. 1A, is placed on the loading/unloading port 32, the first transfer mechanism 34 takes out the wafer W from the carrier C. Then, the wafer W is sequentially transferred to the normal-pressure transfer chamber 31, the alignment chamber 35, and the load-lock chamber 36A. Thereafter, the wafer W is repeatedly transferred between the polyurea film formation module 5A and the annealing module 5B by the second transfer mechanism 42 so that the formation of the above-described polyurea film 13 and the removal of the portion of the front surface of the polyurea film 13 are repeatedly performed. Thus, the polyurea film 13 is formed in the recess 12 as illustrated in FIG. 2B.

Thereafter, the wafer W is transferred by the second transfer mechanism 42 to the cap film formation module 5C where the cap film 14 is formed as illustrated in FIG. 1C. Subsequently, the wafer W is transferred to the annealing module 5D where the polyurea film 13 is removed and the sealed space 15 is formed, as described above with reference to FIG. 1D. Subsequently, the wafer W is transferred by the second transfer mechanism 42 to the VUV irradiation module 5E where the residue 16 is removed as described above with reference to FIGS. 2A and 2B. The residue 16 may be removed as described with reference to FIGS. 3A and 3B. The wafer W from which the residue 16 has been removed is sequentially transferred to the vacuum transfer chamber 38 and the load-lock chamber 36B by the second transfer mechanism 42, and is returned to the carrier C by the first transfer mechanism 34.

Incidentally, the layer 11 forming the recess 12 is not limited to being made of $SiO_2$, but may be made of, for example, silicon nitride (SiN). The cap film 14 may be made of any material as long as it has light transparency and gas permeability so as to enable the residue 16 to be removed and has relatively highly resistant to radicals generated for removing the residue 16. That is, the cap film 14 may be made of an inorganic oxide other than the silicon oxide ($SiO_2$). Specifically, the cap film 14 may be made of, for example, aluminum oxide ($Al_2O_3$) or titanium oxide ($TiO_2$).

The processing gas supplied to the sealed space 15 in order to remove the residue 16 is not limited to the oxygen gas, as long as the processing gas is capable of generating radicals for decomposing organic substances as described above. For example, the processing gas may be a gas of a compound that contains oxygen as a constituent element, such as water or ozone, and generates oxygen radicals in the same manner as the oxygen gas. In addition, an example of the radicals that decompose organic substances may include halogen radicals. Therefore, the processing gas may be a gas containing a compound composed of a halogen. Specifically, for example, a fluorine gas or a chlorine gas may be used as the processing gas.

In addition, the light to be radiated to the wafer W is not limited to VUV but may be any light as long as it is able to propagate in a vacuum atmosphere, pass through the cap film 14, and generate radicals in the sealed space 15. In some embodiments, VUV having a wavelength of 10 nm to 200 nm may be used because it has high transmittance to the cap film 14, and easily activates the processing gas by applying high energy to the processing gas.

The technology described herein is not limited to the embodiment described above, and various modifications, omissions, and substitutions can be made within the scope of the present disclosure. For example, in the above-described embodiment, polyurea was used as a material for forming the sacrificial film, but other organic materials may be used as long as they are thermally-decomposable organic materials. Example of the thermally-decomposable organic materials may include polyurethane, acrylic resin, polyolefin, polycarbonate, polyamide, phenol resin, or a thermally-vaporizable low molecular material, in addition to the polyurea. In addition, the thermally-decomposable organic material may be buried in each recess of a workpiece (substrate) by applying a processing liquid containing the organic material. Further, the cap film 14 may be similarly formed by applying a processing liquid.

Although H6XDA and H6XDI are illustrated as examples of materials for forming the polyurea film 13, the present disclosure is not limited to these materials. For example, the polyurea film 13 may be formed using another known material. In addition, the configuration of the substrate processing apparatus 3 is an example, and is not limited to thereto. For example, each of the annealing modules 5B and 5D may be provided with the light source 61 as in the VUV irradiation module 5E, and may be configured to heat the wafer W by radiating, for example, infrared rays from the light source 61 instead of VUV. In addition, although the polyurea film formation module 5A for forming a polyurea film has been described to separately supply the first film-forming gas and the second film-forming gas to the wafer W so as to perform film formation, the present disclosure is not limited thereto. As an example, the first film-forming gas and the second film-forming gas may be simultaneously supplied to the wafer W so as to perform the film formation.

Evaluation Tests

Next, evaluation tests performed in relation to the embodiments described above will be described.

Evaluation Test 1

As described above with reference to FIGS. 1A to 1D, the formation of the polyurea film 13 in the recess 12 of the wafer W, the formation of the cap film 14 as $SiO_2$, and the annealing process of removing the polyurea film 13 were performed. In such series of processes, after the formation of the cap film 14 and before the annealing process, and after the annealing process, images of vertical cross sections of the wafer W were obtained using a scanning electron microscope (SEM). In addition, the front surface of the wafer W before the annealing process and the front surface of the wafer W after the annealing process were analyzed by Fourier transform infrared spectroscopy (FT-IR) and X-ray photoelectric spectroscopy (XPS). In the above series of processes, the polyurea film 13 was formed in the recess 12 such that the front surface of the polyurea film 13 is lower than the height outside the recess 12, and the cap film 14 was formed to have a thickness of 2 nm.

Figure 7:
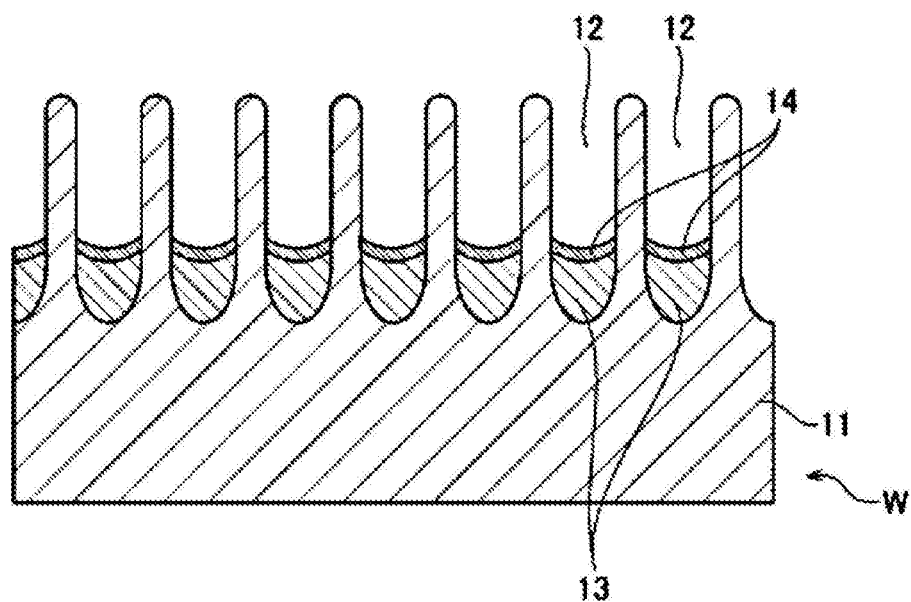
FIG. 7 is a schematic view illustrating an image of a wafer obtained in an evaluation test.
Figure 8:
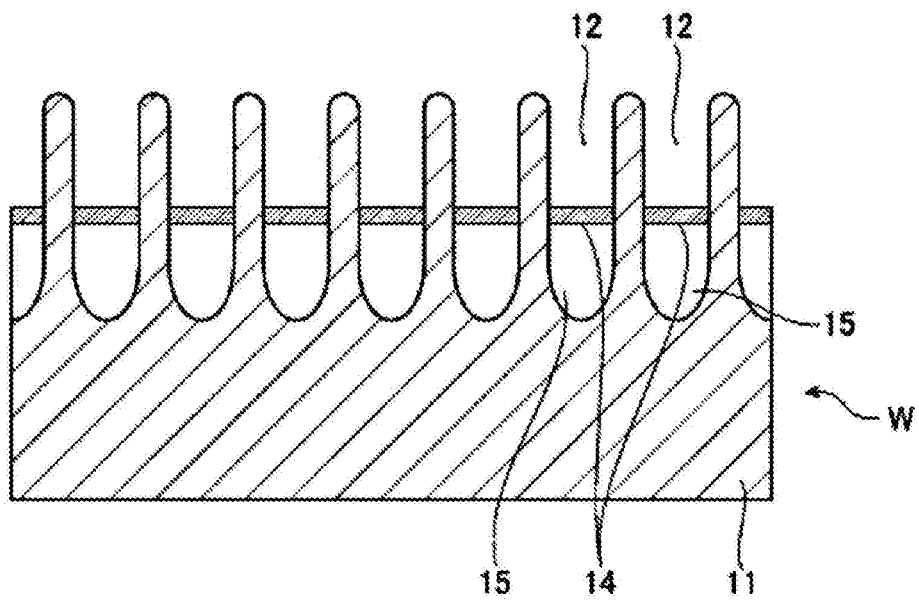
FIG. 8 is a schematic view illustrating an image of the wafer obtained in the evaluation test.

FIGS. 7 and 8 are schematic views illustrating images obtained from the wafer W before the annealing process and the wafer W after the annealing process, respectively. As illustrated in these schematic views, it was confirmed that the polyurea film 13 is removed and the sealed space 15 is formed by performing the annealing process. No residue 16 was confirmed in the sealed space 15 from the images. As illustrated in FIGS. 7 and 8, the cross-sectional shapes of the cap film 14 before and after the annealing process were different from each other.

Comparing infrared absorption spectra (not illustrated) obtained from the wafer W before the annealing process and the wafer W after the annealing process by FT-IR, peaks of absorbance appear at the same wavelength. That is, the presence of the residue 16 after the annealing process was not confirmed from the FT-IR.

Figure 9:
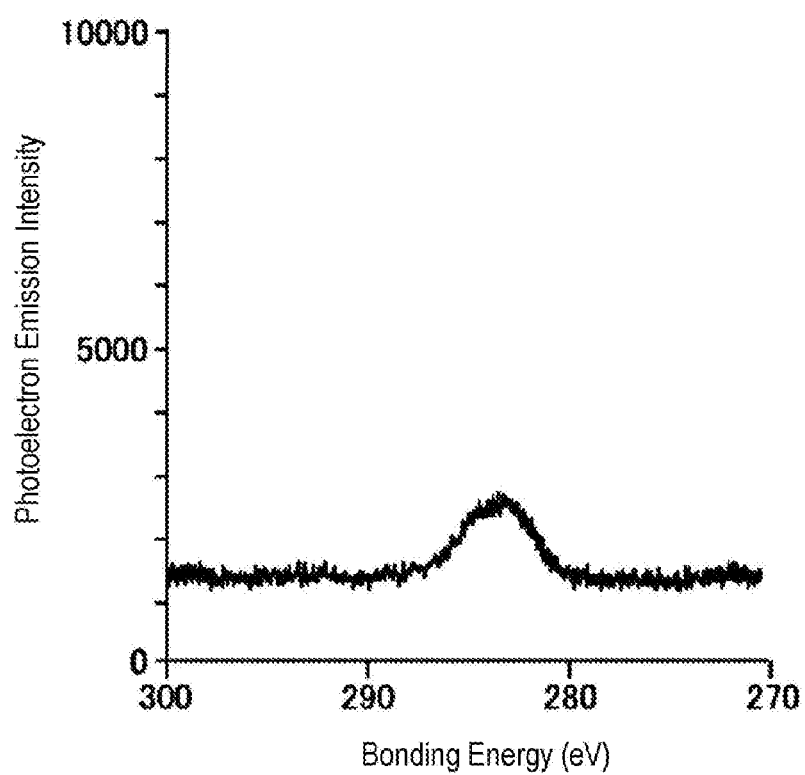
FIG. 9 is a graph representing a result of the evaluation test.

However, the presence of the residue 16 was confirmed from the analysis results by XPS. Describing the XPS analysis method in detail, $SiO_2$ constituting the front surface of the wafer W was etched by 10 nm for 100 sec. Therefore, the etching rate was 0.1 nm/sec. A measurement was performed in each cycle with 5 seconds during this etching as one cycle. In a graph of FIG. 9, for the sake of avoiding complexity of illustration due to overlapping of waveforms, only the spectrum of a first cycle is displayed. The vertical axis of the graph represents photoelectron emission intensity, and the horizontal axis of the graph represents bonding energy (unit: eV). Looking at the waveform of the graph, a relatively small peak corresponding to the residue 16 for C1s appears around 285 eV. The C1s peaks became smaller in the later cycles.

Evaluation Test 2

In Evaluation Test 2, the formation of the polyurea film 13 in the recess 12 of the wafer W, the formation of the cap film 14, and the annealing process of removing the polyurea film 13 were sequentially performed, as in Evaluation Test 1. Thereafter, unlike Evaluation Test 1, the wafer W thus annealed was accommodated in the processing container, heated to 150 degrees C., and air and $N_2$ gas were supplied into the processing container, and the internal pressure of the processing container was set to 200 Torr ($2.66 \times 10^4$ Pa). In such a state, the wafer W was irradiated with VUV for 5 minutes, and the XPS-based analysis was performed in the same manner as in Evaluation Test 1. Each of the flow rates of the $N_2$ gas and the air supplied into the processing container was set to 1 slm.

Figure 10:
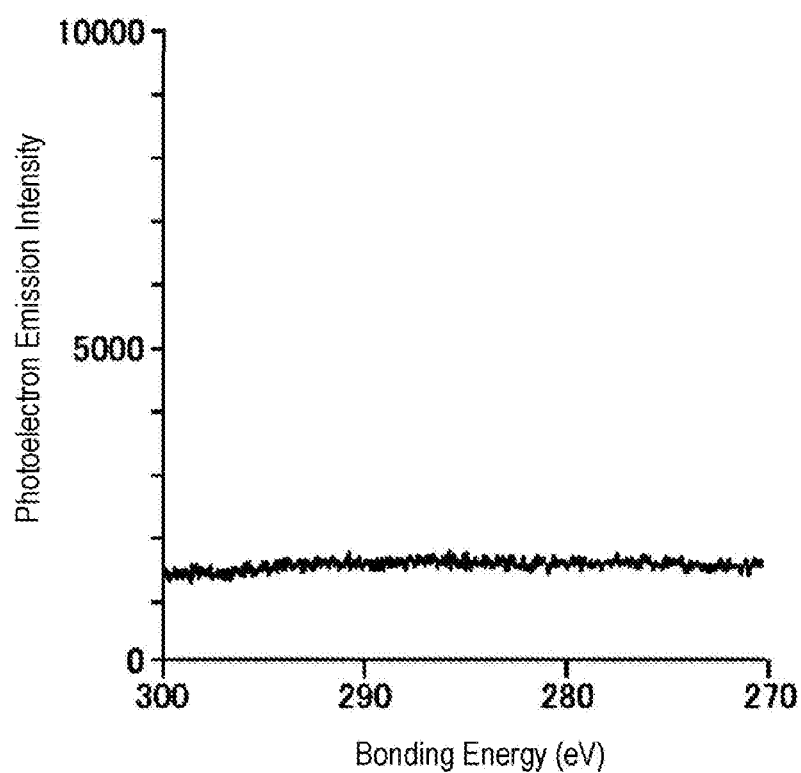
FIG. 10 is a graph representing a result of the evaluation test.

A graph of FIG. 10 shows the results of Evaluation test 2. As in the graph of FIG. 9, the vertical axis and the horizontal axis represent photoelectron emission intensity and bonding energy, respectively. In the graph of FIG. 10, no C1s peak was observed in the vicinity of 285 eV. The graph of FIG. 10 shows only the spectrum of the first cycle, as in the graph of FIG. 9, but C1s peaks were not observed in the spectra of other cycles, similarly to the spectra of the first cycle.

From the results of Evaluation Tests 1 and 2, it can be seen that the residue 16 generated from the polyurea film 13 slightly remains on the wafer W after the polyurea film 13 was removed by the annealing process. Then, it was confirmed that the residue 16 was removed by performing both the supply of oxygen around the wafer W and the VUV irradiation. Therefore, the effects of the above embodiment were confirmed by Evaluation Tests 1 and 2.

Evaluation Test 3

In Evaluation Test 3 (3-1 to 3-8), a process of heating the wafer W having a polyurea film formed on the front surface thereof at 150 degrees C. inside the processing container and irradiating the front surface of the wafer W with VUV was performed. This process was performed on the plurality of wafers W. In processing each wafer W, the $N_2$ gas alone, or both the $N_2$ gas and air were supplied into the processing container. In addition, for each wafer W, the process was performed while changing the combination of the flow rate of the gas to be supplied into the processing container, the total internal pressure of the processing container, the partial pressure of oxygen, and the processing time. Then, for each of the processed wafers W, a film thickness maintenance rate of the polyurea film (film thickness after the process/film thickness before the process)×100 was calculated. The processing conditions of each of Evaluation Tests 3-1 to 3-8 are as below. Each of Evaluation Tests 3-1 to 3-8 was performed by setting the processing time of the wafer W to 1 minute, 3 minutes, or 5 minutes.

In Evaluation Test 3-1, the flow rate of the $N_2$ gas was set to 0.1 slm, and the total internal pressure of the processing container was set to 0.4 Torr (53.3 Pa). In Evaluation Test 3-2, the flow rate of the $N_2$ gas was set to 0.1 slm, and the total internal pressure of the processing container was set to 10 Torr ($1.33 \times 10^3$ Pa). As Evaluation Test 3-3, the flow rate of the $N_2$ gas was set to 0.1 slm, and the total internal pressure of the processing container was set to 600 Torr ($8.00 \times 10^4$ Pa). In these Evaluation Tests 3-1 to 3-3, air was not supplied into the processing container. In Evaluation Test 3-4, the flow rate of the $N_2$ gas was set to 0.1 slm, and the total internal pressure of the processing container was set to 10 Torr. Air was supplied such that the oxygen partial pressure in the processing container become 2 Torr ($2.66 \times 10^2$ Pa).

In the following Evaluation Tests 3-5 to 3-8, the $N_2$ gas and air were supplied into the processing container. In Evaluation Test 3-5, each of the flow rates of the $N_2$ gas and the air was set to 1 slm, the total internal pressure of the processing container was set to 100 Torr ($1.33 \times 10^4$ Pa), and the partial pressure of oxygen in the processing container was set to 10 Torr. In Evaluation Test 3-6, each of the flow rates of the $N_2$ gas and the air was set to 1 slm, the total internal pressure of the processing container was set to 100 Torr, and the partial pressure of oxygen in the processing container was set to 20 Torr ($2.66 \times 10^3$ Pa). In Evaluation Test 3-7, each of the flow rates of the $N_2$ gas and the air was set to 1 slm, the total internal pressure of the processing container was set to 200 Torr ($2.66 \times 10^4$ Pa), and the partial pressure of oxygen in the processing container was set to 20 Torr. In Evaluation Test 3-8, each of the flow rates of the $N_2$ gas and the air was set to 1 slm, the total internal pressure of the processing container was set to 600 Torr, and the partial pressure of oxygen in the processing container was set to 60 Torr ($7.98 \times 10^3$ Pa).

Figure 11:
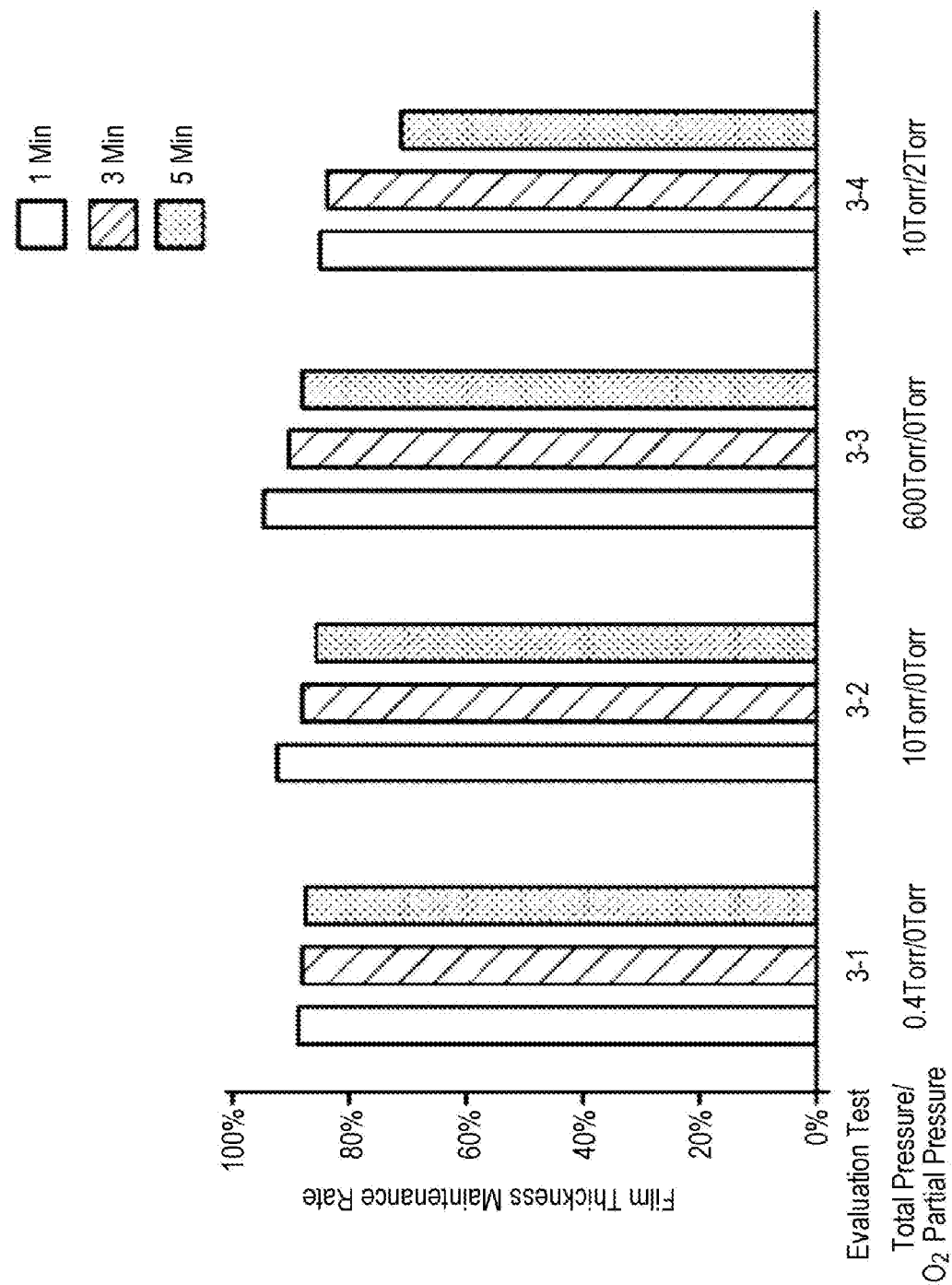
FIG. 11 is a graph representing a result of the evaluation test.
Figure 12:
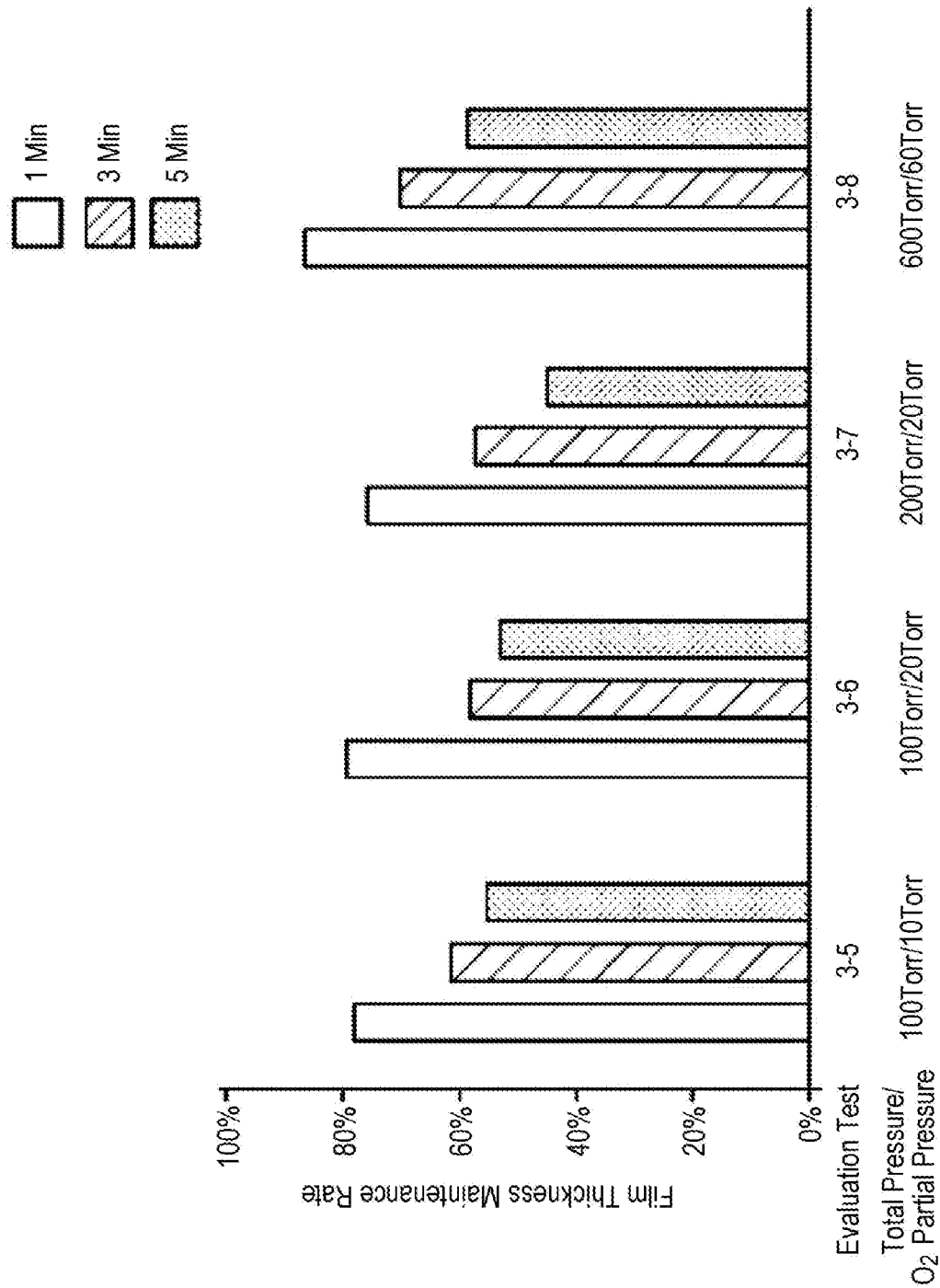
FIG. 12 is a graph representing a result of the evaluation test.

The results of Evaluation Tests 3-1 to 3-4, in which the flow rate of the $N_2$ gas was 0.1 slm, are shown in a bar graph of FIG. 11, and the results of Evaluation Tests 3-5 to 3-8, in which each of the flow rates of the $N_2$ gas and the air was 1 slm, are shown in a bar graph of FIG. 12. The vertical axis of the graphs in FIGS. 11 and 12 represent the above-mentioned film thickness maintenance rate (unit: %). In the graphs, bars without patterns, bars with diagonal lines, and bars with dots are test results obtained when the processing times were 1, 3, and 5 minutes, respectively.

As shown in the graphs, in all of Evaluation Tests 3-1 to 3-8, the longer the processing time, the lower the film thickness maintenance rate. That is, it can be seen that the removal of the polyurea film progresses as the processing time becomes longer. However, in Evaluation Tests 3-1 to 3-3, in which no air was supplied, the film thickness maintenance rate at each processing time was a high value of 85% or more, and the removal of the polyurea film was difficult to progress. Comparing Evaluation Tests 3-1 to 3-3 with Evaluation Test 3-4 in which air was supplied, the film thickness maintenance rate in Evaluation Test 3-4 is lower than those in Evaluation Tests 3-1 to 3-3 when the processing times were the same. Also, comparing the results of Evaluation Tests 3-5 to 3-8 in which air was supplied, with the results of Evaluation Tests 3-1 to 3-3, the film thickness maintenance rates in Evaluation Tests 3-5 to 3-8 are lower than those in Evaluation Tests 3-1 to 3-3 when the processing times were the same.

From these results, it can be seen that in removing the polyurea film formed on the wafer W by the VUV irradiation, the film thickness maintenance rate is high, that is, the film removal efficiency is low when air does not exist around the wafer W. It may be considered that, when air is supplied, the $O_2$ gas in the air is activated by VUV and acts on the polyurea film.

The residue 16 described in the embodiment is an organic substance similarly to the polyurea film. Thus, it is considered that the removal efficiency deteriorates unless oxygen is supplied during the VUV irradiation. Accordingly, from the results of Evaluation Test 3, it can be seen that it is difficult to completely remove the residue 16 only by the VUV irradiation in the above embodiment, and that it is effective to activate the $O_2$ gas supplied to the wafer W so as to remove the residue 16, as described above.

Looking at the results of Evaluation Tests 3-4 to 3-8 in which air was supplied into the processing container, the film thickness maintenance rates in Evaluation test 3-4, in which the partial pressure of the oxygen gas was relatively low, and Evaluation Test 3-4, in which the partial pressure of the oxygen gas was relatively high, were high compared to those in Evaluation Tests 3-5 to 3-7. The reason that each of the film thickness maintenance rates in Evaluation Tests 3-4 and 3-8 was relatively high is believed to be due to the fact that sufficient oxygen radicals were not generated and that the partial pressure of the oxygen gas was high and thus VUV was absorbed by the oxygen gas, as described in the embodiment. Meanwhile, in Evaluation Tests 3-5 to 3-7, the film thickness maintenance rates were sufficiently low, and in Evaluation Tests 3-5 to 3-7, a favorable result was obtained in Evaluation Test 3-7 since the film thickness maintenance rate is the lowest. The detailed results of Evaluation Test 3-7 were as follows: when the processing times were 1 minute, 3 minutes, and 5 minutes, the removal rates of polyurea films (removed film thickness/processing time) were 45 nm/min, 28 nm/min and 21 nm/min, respectively.

From the results of Evaluation Tests 3-4 to 3-8, it can be seen that there is an appropriate range for the partial pressure of the oxygen gas around the wafer W during the light irradiation. Since Evaluation Tests 3-5 to 3-7 showed good results, it can be seen that the oxygen partial pressure is preferably set to 10 Torr ($1.33 \times 10^3$ Pa) to 20 Torr ($2.66 \times 10^3$ Pa). As described above, Evaluation Test 3-7, in which the oxygen partial pressure was set to 20 Torr, showed a more preferable film thickness maintenance rate, but Evaluation Test 3-6, in which the oxygen partial pressure was lower by 10 Torr, also showed a favorable result. Therefore, it is considered that it is possible to obtain a high removal rate even when the oxygen partial pressure is set to 30 Torr ($3.99 \times 10^3$ Pa), which is higher than 20 Torr by 10 Torr. Therefore, it is considered that the oxygen partial pressure is preferably set to a value of 10 Torr to 30 Torr.

According to the present disclosure in some embodiments, when forming a sealed space surrounded by a recess and a film formed on the recess in a substrate, it is possible to prevent foreign matter from remaining in the sealed space.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, the method comprising:
    forming a recess on a front surface of the substrate;
    burying an organic film in the recess;
    forming a coating film so as to cover the organic film;
    heating the substrate to turn the organic film into a gas, removing the gas from an interior of the recess by causing the gas to pass through the coating film, and forming in the substrate a sealed space surrounded by the recess and the coating film;
    supplying a processing gas into the sealed space; and
    irradiating the substrate with a light to activate the processing gas in the sealed space, causing a reaction product gas to pass through the coating film, and removing the reaction product gas, wherein the reaction product gas is generated by a reaction between a residue of the organic film and the activated processing gas in the sealed space,
    wherein the irradiating the substrate with a light is performed after the supplying a processing gas,
    wherein the irradiating the substrate with a light includes setting a pressure around the substrate to a first pressure,
    wherein the supplying a processing gas includes setting the pressure around the substrate to a second pressure higher than the first pressure,
    wherein the first pressure is within a range of $1.33 \times 10$ Pa to $1.33 \times 10^2$ Pa, and
    wherein the second pressure is within a range of $1.33 \times 10^4$ Pa to $1.33 \times 10^5$ Pa.

2. The method of claim 1, wherein the coating film is an inorganic oxide.

3. The method of claim 2, wherein the inorganic oxide is a silicon oxide.

4. The method of claim 1, wherein the processing gas is a gas containing oxygen.

5. The method of claim 4, wherein the light is a vacuum ultraviolet light.

6. The method of claim 1, wherein the light is a vacuum ultraviolet light.

* * * * *